United States Patent
Gebauer et al.

(12)

(10) Patent No.: US 6,851,598 B2
(45) Date of Patent: Feb. 8, 2005

(54) ELECTRONIC COMPONENT WITH A SEMICONDUCTOR CHIP AND METHOD FOR PRODUCING THE ELECTRONIC COMPONENT

(75) Inventors: Uta Gebauer, München (DE); Harry Hedler, Germering (DE); Jürgen Högerl, Regensburg (DE); Volker Strutz, Tegernheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/205,081

(22) Filed: Jul. 25, 2002

(65) Prior Publication Data

US 2003/0038157 A1 Feb. 27, 2003

(30) Foreign Application Priority Data

Jul. 25, 2001 (DE) .......................................... 101 35 393

(51) Int. Cl.[7] ........................... B23K 31/00; B23K 31/02
(52) U.S. Cl. ............................. 228/180.22; 228/180.1; 228/180.21
(58) Field of Search ...................... 228/180.22, 180.21, 228/180.1; 438/108, 119; 257/737, 750, 773–779, 786

(56) References Cited

U.S. PATENT DOCUMENTS

| 4,217,024 A | * | 8/1980 | Aldridge et al. ............ 439/381 |
| 5,186,383 A | | 2/1993 | Melton et al. |
| 5,399,898 A | * | 3/1995 | Rostoker ..................... 257/499 |
| 5,400,950 A | | 3/1995 | Myers et al. |
| 5,557,150 A | * | 9/1996 | Variot et al. ................. 257/787 |
| 5,783,465 A | * | 7/1998 | Canning et al. ............. 438/119 |
| 5,985,682 A | * | 11/1999 | Higgins, III .................. 438/10 |
| 6,073,829 A | | 6/2000 | Pienimaa |
| 6,126,455 A | * | 10/2000 | Haba ............................ 439/70 |
| 6,336,269 B1 | * | 1/2002 | Eldridge et al. .............. 29/885 |
| 6,555,415 B2 | * | 4/2003 | Hedler ........................ 438/108 |
| 6,563,330 B1 | * | 5/2003 | Maruyama et al. ......... 324/754 |
| 6,617,521 B1 | * | 9/2003 | Saito et al. ................. 174/260 |
| 2003/0067755 A1 | * | 4/2003 | Haimerl et al. ............. 361/773 |

FOREIGN PATENT DOCUMENTS

| DE | 198 41 996 A1 | 3/2000 |
| DE | 100 45 043 A1 | 4/2001 |
| JP | 02 180 036 A | 7/1990 |
| JP | 05 275 489 A | 10/1993 |
| JP | 11 121 649 A | 4/1999 |
| JP | 11121649 A | * 4/1999 |
| JP | 11 204 564 A | 7/1999 |

* cited by examiner

*Primary Examiner*—L. Edmondson
(74) *Attorney, Agent, or Firm*—Laurence A. Greenberg; Werner H. Stemer; Ralph E. Locher

(57) ABSTRACT

An electronic component with at least one semiconductor chip and a wiring layer are described. The wiring layer has elastic contact elements of low mechanical strength in the spatial directions x, y and z, which can be electrically connected to corresponding contact terminal areas of a printed circuit board. The semiconductor chip or the wiring layer additionally has at least two spacers for the mechanical connection to a printed circuit board. A method for producing the electronic component is also described.

25 Claims, 2 Drawing Sheets

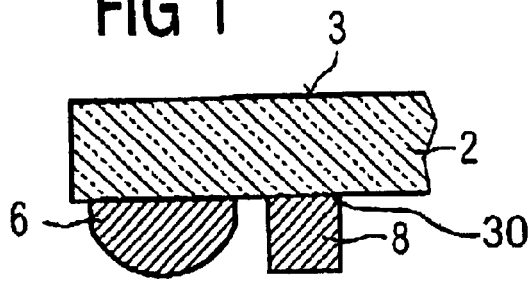
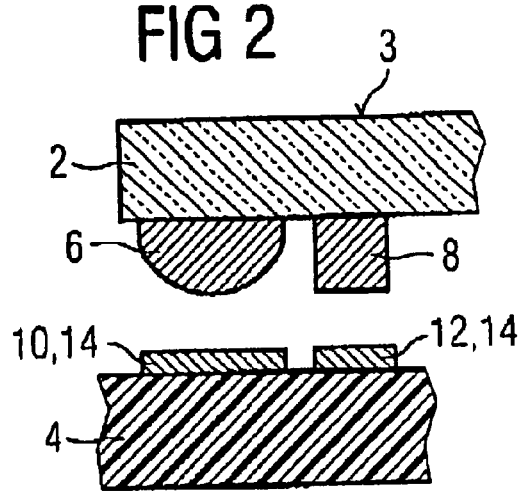
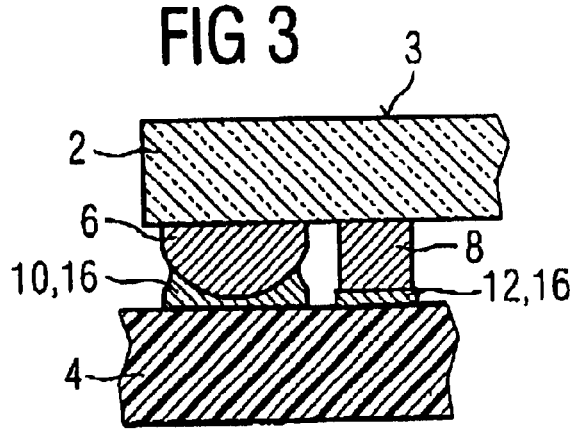

ELECTRONIC COMPONENT WITH A SEMICONDUCTOR CHIP AND METHOD FOR PRODUCING THE ELECTRONIC COMPONENT

BACKGROUND OF THE INVENTION

Field of the Invention

The invention relates to an electronic component with at least one semiconductor chip and a method for its production.

The minimum overall size of circuits with semiconductor components is primarily determined by the size of the electrical connections between the electronic component and a printed circuit board. The limits of possible miniaturization are determined in particular by the connections between the contact areas of a semiconductor chip or its wiring layer and the contact terminal areas of the printed circuit board. In many applications, the production of microscopically small connections between the semiconductor chip or its wiring layer and the printed circuit board is desirable. In this respect, the semiconductor chip or its wiring layer has contact elements which, when the semiconductor chip is placed precisely onto the printed circuit board, are pressed onto defined contact terminal areas and are thereby readily pressed together in the x, y and z directions, displaced or subjected to loading in some other way. The contact terminal areas of the printed circuit board are covered with a soldering paste, which during the subsequent heating of the electronic components provides an intimate soldered connection of the contact terminal areas to the contact elements.

During the soldering, known as reflow, keeping the sensitive contact elements of the semiconductor chip containing contact wires or contact strips mechanically in their position with respect to the printed circuit board is a problem on account of their small contact areas, since they could otherwise lose contact or because, if contact is too close, the contact wires or contact strips could be excessively loaded and damaged. There is also the risk of the contact wires or contact strips being moved back and forth or pressed together during further method steps, for example when applying heat-conducting cooling elements on the rear side of the semiconductor chip during the soldering operation.

SUMMARY OF THE INVENTION

It is accordingly an object of the invention to provide an electronic component with a semiconductor chip and a method for producing the electronic component that overcome the above-mentioned disadvantages of the prior art devices and methods of this general type, in which a mechanical connection between the electronic component and a printed circuit board is as compact and mechanically stable as possible and, in spite of the delicate contact elements, can be produced at low cost.

With the foregoing and other objects in view there is provided, in accordance with the invention, an electronic component. The electronic component contains a printed circuit board having contact terminal areas, at least one semiconductor chip, and a wiring layer disposed on the semiconductor chip. The wiring layer has elastic contact elements of low mechanical strength in spatial directions x, y and z. The elastic contact elements are electrically connected to corresponding ones of the contact terminal areas. At least two spacers are disposed on the semiconductor chip or the wiring layer. The spacers are mechanically connected to the printed circuit board.

According to the invention, the electronic component has at least one semiconductor chip and a wiring layer applied to the semiconductor chip, the wiring layer being provided with elastic contact elements of low mechanical strength in the spatial directions x, y and z, which can be electrically connected to corresponding contact terminal areas of a printed circuit board. The semiconductor chip has in this case an active upper side with integrated circuits and a passive rear side without integrated circuits. The active upper side adjoins the wiring layer. According to the invention, the semiconductor chip or the wiring layer is also able to be mechanically connected to the printed circuit board by at least two spacers.

The electronic component according to the invention has the advantage that the elastic contact elements are kept free of any mechanical loading. They serve merely for the electrical connection between the semiconductor chip or wiring layer and the printed circuit board. The spacers according to the invention on the semiconductor chip or on the wiring layer allow a stable mechanical connection to be produced between the printed circuit board and the semiconductor chip or the wiring layer without any other forms of attachment, points of adhesion or the like being necessary. In this respect, at least two spacers are provided; however, three spacers are ideal for the statically defined positional fixing of the two parts with their faces in relation to each other.

In the case of the invention, the wiring layer and the printed circuit board can be connected at a defined distance from each other by the spacers according to the invention, which has the advantage of an exactly defined deflection of the elastic contact elements. In this way it can be ensured that the elastic contact elements come into contact with the corresponding contact terminal areas of the printed circuit board without being excessively loaded or deformed thereby.

One embodiment of the invention provides that the at least two spacers are respectively formed as soldered connections or contacts. This embodiment according to the invention has the advantage of a secure and defined mechanical connection between the semiconductor chip with the wiring layer and the printed circuit board, the function of the elastic contact elements remaining confined exclusively to the electrical connection. With the soldered spacers according to the invention there is no need for points of adhesion or the like, which have to be removed again after the soldering of the electrical connections. It is similarly possible to dispense with any subsequent attachment of spacing clamps for the local mechanical fixing of the elastic contact elements.

In a further embodiment of the invention, it is provided that the wiring layer is provided on its underside, facing away from the electronic component, with at least two contact bumps and/or contact pins as spacers, which correspond to metallic resting areas on the upper side of the printed circuit board. This embodiment according to the invention has the advantage of a mechanical connection that can be simply produced, is compact, and at the same time can be soldered to the electrical contacts. Consequently, only a single soldering operation is necessary for the connection of the contact bumps or pins to the metallic resting areas and for the connection of the electrical contacts.

One embodiment according to the invention provides that the wiring layer and the printed circuit board can be soldered to resting areas of the printed circuit board by at least three contact bumps and/or contact pins as spacers, which has the advantage of better static certainty of the position of the two parts in relation to each other. The at least three spacers in the form of contact bumps or contact pins are in this case advantageously located at opposite regions of the wiring layer, close to the edges, so that the elastic contact elements lie within the area outlined by the at least three spacers.

In one embodiment of the invention, the elastic contact elements are formed as elastomeric humps, for example of plastic, and may be provided either in an electrically conducting manner or partly with a resilient metallic coating, which has the advantage of compensating exactly for the spacing between the wiring layer and the printed circuit board. At the same time, the elastomeric form of the contact bumps allows slight differences in level to be evened out, so that not only the unevennesses on the surface of the printed circuit board but also differences in the height of the elastomeric humps are evened out without any adverse influence on the exactly fitting positionability of the electronic component.

According to the invention, a further embodiment provides in each case an identical, exactly defined height of the contact bumps or contact pins as spacers, which has the advantage of optimum fitting accuracy of the mechanical connection.

In a further embodiment of the invention, it is provided that the contact bumps or contact pins as spacers are exceeded slightly in height by the elastic contact elements in the relaxed state. In this way it can be ensured that the elastic contact elements are in contact with the corresponding contact terminal areas of the printed circuit board as soon as the electronic component with the semiconductor chip and the wiring layer is placed with its spacers onto the corresponding resting areas of the printed circuit board.

In the case of one embodiment of the invention, the elastic contact elements are formed as flexible contact wires. This embodiment has the advantage of a very compact form of a large number of contact wires lying close together, which in the relaxed state have a defined position and when resting on the corresponding contact areas of the printed circuit board are under defined prestress.

An alternative embodiment of the invention provides that the elastic contact elements are formed as flat contact strips, which has the advantage of a well-definable spring action of the contact strips. These may be configured in the form of a leaf spring and consequently impose a precisely definable pressing force on the contact terminal areas.

One embodiment of the invention also provides that the elastic contact elements are provided with a metallic (i.e. gold) covering. A covering of this type has the advantage that the metallic surfaces remain free of any oxidation and therefore ensure an electrical connection just by an elastic pressing force. Moreover, gold has a very good electrical conductivity, which is advantageous with regard to electrical signal transmission. Preferably the elastic contact elements are in the shape of a hump formed of plastic and are covered at least at its crest with the metallic covering.

In one embodiment of the invention, it is also provided that the elastic contact elements are in each case in electrically conducting contact at their free ends, facing the printed circuit board, with corresponding contact terminal areas on the surface of the printed circuit board. In this way it can be reliably prevented that individual contacts remain without contact in relation to their corresponding contact points.

A further embodiment according to the invention provides that the elastic contact elements are respectively soldered to the corresponding contact terminal areas of the printed circuit board, which has the advantage of a reliable electrical and mechanical connection of all the provided contacts between the electronic component and the printed circuit board.

One embodiment of the invention provides that the elastic contact elements are microscopically small. Therefore, the elastic contact elements are so small in their dimensions that they can no longer be perceived with the naked eye, but only under an optical microscope. As a result, extremely compact and highly integrated components can be realized.

In one embodiment of the invention, the electronic component and the printed circuit board are soldered to each other by heating. This soldering process has the advantage that uniform heating of all the locations to be soldered is thereby possible without direct contact of the soldered joints, for example by a heating device, being necessary. This type of connection is consequently suitable in particular for very small and highly integrated structures.

Finally, a further embodiment of the invention provides that the printed circuit board is electrically and mechanically connected on both sides to in each case at least one semiconductor chip with a wiring layer with elastic contact elements. This embodiment has the advantage of a very compact configuration with a printed circuit board provided with interconnects on both sides and semiconductor components with wiring layers mounted on both sides. In the case of mounted semiconductor components lying directly opposite, it is also advantageous that the heat can be concentrated on a relatively small region during the soldering process.

In the case of a method for producing an electronic component with a semiconductor chip and with a wiring layer applied to the semiconductor chip, the wiring layer is provided with elastic contact elements. Furthermore, a printed circuit board can be electrically and mechanically connected to the wiring layer. According to the invention, the method has the following method steps. After providing a semiconductor chip having an active upper side and a passive rear side, a wiring layer is applied to the active upper side of the semiconductor chip. The wiring layer is provided on its underside, facing away from the active upper side of the semiconductor chip, with elastic contact elements of low mechanical strength in the three spatial directions x, y and z. At least two spacers for the mechanical connection to a printed circuit board are provided on the semiconductor chip or the wiring layer. After applying the wiring layer, bonding connections are produced from the active upper side of the semiconductor chip to contact terminals on the underside of the wiring layer, facing away from the active front side of the semiconductor chip.

Subsequently, a printed circuit board with electrical contact terminal areas can be prepared, the contact terminal areas corresponding to the free ends of the elastic contact elements of the wiring layer. Resting areas on the printed circuit board correspond to the spacers of the electronic component with the wiring layer. A soldering paste is applied to the contact terminal areas and to the resting areas of the printed circuit board. After that, the semiconductor chip with the wiring layer is positioned on the printed circuit board, the elastic contact elements resting on the contact terminal areas and the spacers resting on the resting areas. The soldering paste on the contact terminal areas and the resting areas is liquefied by heating the spacers, whereby electrical and mechanical connections are produced between the touching contact regions.

This method according to the invention has the advantage that very compact electrical connections can be produced with it and they can be made with precision. Relieving the elastic contact elements acting as electrical connection points of any mechanical loading allows extremely small electrical contacts, down to microscopically small structures, to be produced in a reliable way. The mechanical support between the wiring layer and the printed circuit board is realized by additional spacers which are disposed on the semiconductor chip or the wiring layer and can be soldered like electrical contacts.

An example of how the method according to the invention can be carried out provides that the at least two spacers are formed as contact bumps and/or as contact pins which are placed on resting areas on the printed circuit board corresponding to them. This example of how the method can be carried out has the advantage that it makes it possible in a very simple and consequently low-cost way for reliable supporting of the semiconductor chip with the wiring layer on the printed circuit board to be produced, providing mechanical relief of the elastic contact elements.

In a further example of how the method according to the invention can be carried out, the elastic contact elements are pressed counter to their tension against the respectively corresponding contact terminal areas when the spacers are placed onto the resting areas on the printed circuit board corresponding to them. In this way it is ensured that the elastic contact elements are in reliable contact with the contact terminal areas, and consequently a reliable electrical connection is produced without the risk of the elastic contact elements being excessively deformed, which would entail the risk of short-circuits, contact separations or some other form of damage to the sensitive elastic contact elements of low mechanical strength.

An example of how the method can be carried out according to the invention also envisages electrically and mechanically connecting the printed circuit board on both sides to in each case at least one semiconductor chip with a wiring layer and elastic contact elements. This variant according to the invention of the method has the associated advantage that very compact and space-saving electronic components can be produced in this way. Moreover, with the printed circuit board to be fitted with components on both sides, the heating effect during soldering can be confined to a relatively small region, whereby the risk of component damage on account of excessive exposure to heat is reduced.

Furthermore, an example of how the method can be carried out provides that, for connecting the elastic contact elements, the electronic component is heated to a soldering temperature, which has the advantage of low-stress, reliable soldering of all the electrical contacts. At the same time, the spacers are soldered to the resting areas in the same operation, whereby altogether a mechanical connection involving little material stress is produced.

Finally, an example of how the invention can be carried out provides that largely the entire surface area of the passive rear side of each semiconductor chip is brought into contact with a heat-dissipating device during the soldering operation. This variant of the method has the associated advantage that the heat produced during the soldering operation can in this way be dissipated quickly and reliably from the semiconductor component. In addition, the heating necessary for liquefying the soldering material, for example the soldering paste, remains largely confined to the region of the contacts to be soldered, while the adjacent semiconductor chips are protected against excessive exposure to heat by the contact with the cooling devices, referred to for example as heat spreaders. The heat transfer from the rear sides of the semiconductor chips to the cooling devices can be further improved if the passive rear sides of the semiconductor chips are provided with a heat-conducting layer. Suitable for example as such a layer is a plastics material into which fine metallic powder is incorporated during the molding operation. Such a plastics layer with incorporated metallic powder is also often referred to as "gap filler material".

To sum up, the following aspects are obtained in the present invention. For mechanically relieving flexible and/or elastic electronic contact elements between an electronic component with a wiring layer and a printed circuit board, fixed or flexible supports are provided on the wiring layer as spacers in the form of spherical contact pins or contact bumps. The spacers are either coated with a solderable metallic layer or consist completely of a solderable material. The contact pins or bumps as spacers may be applied to the semiconductor chip with the wiring layer either during a production process together with the elastic electrical contact elements or in a separate processing step. During the soldering operation, the contact pins or contact bumps increase the effective contact area with respect to the wiring layer with the semiconductor chip mounted on it. In particular in the case of modules fitted with components on both sides, i.e. in the case of a printed circuit board fitted with electronic components from both sides, the contact pins provide a stable connection of the components lying underneath, which could otherwise easily fall off. Alternatively, the electronic components lying underneath may be lightly pressed against the printed circuit board and held in their position, for example with the aid of a clip, where they are supported by the contact pins or bumps. The soldering operation has the effect of permanently connecting the spacers acting as supporting points to the printed circuit board.

During the soldering operation, heat sinks, known as heat spreaders, which provide rapid dissipation of the high temperatures from the sensitive electronic semiconductor components, are pressed on the rear side of the semiconductor chips. For better heat transfer from the passive rear sides of the semiconductor chips to the cooling devices, the rear sides of the chips may also be covered with what is known as "gap filler material". This is understood as meaning a molded layer of plastic which is preferably provided with incorporated metallic powder. The spacers in the form of contact pins or bumps make it possible for the heat sinks to be pressed into place without the elastic contact elements being loaded and consequently damaged.

Other features which are considered as characteristic for the invention are set forth in the appended claims.

Although the invention is illustrated and described herein as embodied in an electronic component with a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, partial, cross-sectional view of a semiconductor chip with spacers according to the invention;

FIG. 2 is an exploded, partial, cross-sectional view of a the semiconductor chip with an added printed circuit board;

FIG. 3 is a partial, cross-sectional view corresponding to FIG. 2 with the semiconductor chip soldered on the printed circuit board.

DESCRIPTION OF THE PREFERRED EMBODIMENTS

Figure 4:
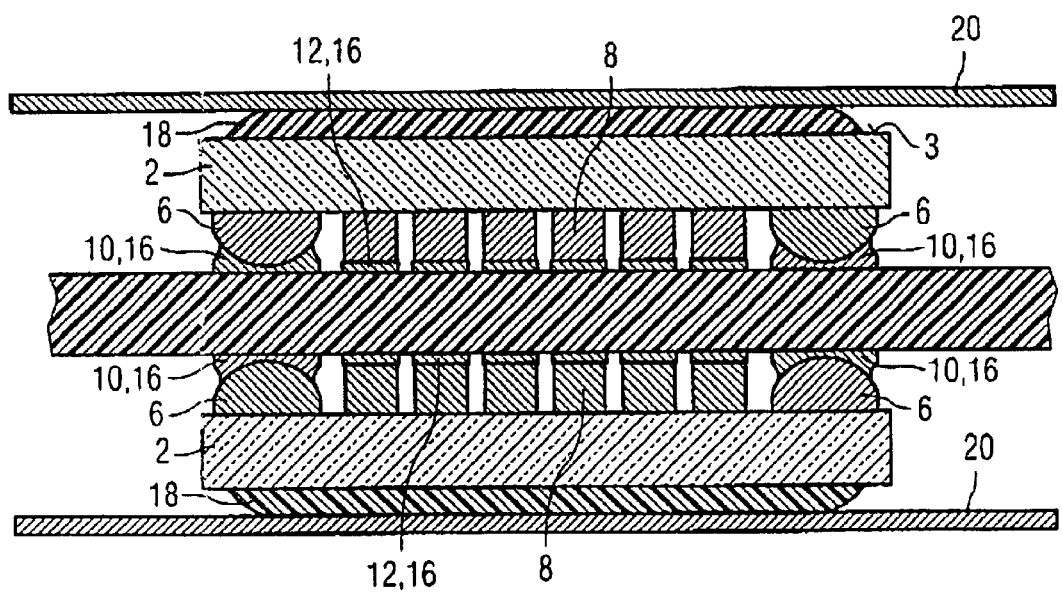
FIG. 4 is a partial, cross-sectional view of two electronic components that are connected to the printed circuit board.

Referring now to the figures of the drawing in detail and first, particularly, to FIG. 1 thereof, there is shown an exemplary embodiment of the invention. In the figures, the same parts are always provided with the same designations and in some cases are not discussed more than once.

FIG. 1 shows a schematic cross section of a detail of a semiconductor chip 2 with a wiring layer 30. For reasons of simplicity, the subassembly is merely referred to hereafter as the semiconductor chip 2; however, this always refers to the entire subassembly with the semiconductor chip 2 and the wiring layer 30 disposed on it. The semiconductor chip 2 has an active front side, which is provided with semiconductor circuit structures, and a passive rear side 3, without semiconductor circuit structures. In the cross section of a detail shown in FIG. 1, the active upper side of the semiconductor chip 2 faces downward. On an outer edge of the semiconductor chip 2, a likewise downward-facing spacer 6 that is perpendicular to the active upper side and in the form of a contact bump 6 can be seen. The spacer 6 may, for example, be formed of plastic and be covered by a solderable metal layer. Alternatively, the spacer 6 may be formed completely of a solderable metal. The semiconductor chip 2 is preferably provided with at least two such spacers 6 in the form of contact bumps, which are respectively attached to an outer edge of a front side of the semiconductor chip 2 facing a printed circuit board 4 (or the wiring layer 30 of the chip 2). A more favorable and more stable support can be achieved, however, with three, four or more of such spacers 6.

Alongside the spacer 6 is a single resilient contact element 8, which is shown by way of example as representative of a large number of parallel elastic contact elements 8. The elastic contact element 8 may, for example, be an elastic wire of a round or flat cross section which is bent in such a way that, when its free end is placed on a contact area, it is bent slightly toward the front side of the semiconductor chip 2 and is thereby in secure contact with the corresponding contact terminal area 12 of the printed circuit board 4. The elastic contact element 8 is preferably configured as a gold wire or strip, since this material has optimum properties with regard to freedom from oxidation and electrical conductivity.

Also shown in FIG. 1 is the elastic contact element 8 which, in the relaxed state, protrudes downward slightly beyond the outer periphery of the spacer 6 and, when the spacer 6 is placed onto a resting area 10 of the printed circuit board 4, reliably comes to bear against its associated contact terminal area on the printed circuit board 4.

FIG. 2 shows a schematic cross section of a detail of the structure corresponding to FIG. 1 with the associated printed circuit board 4, on which the spacers 6 come to bear, as now described. The flat printed circuit board 4 is provided with the resting areas 10 and with the contact terminal areas 12. The resting areas 10 are in this case preferably configured as isolated metal areas, i.e. not connected to interconnects, and are intended to serve for mechanical positioning, fixing and spacing. The contact terminal areas 12 are in connection with non-illustrated interconnects of the printed circuit board 4.

The contact areas 12 correspond to the elastic contact elements 8 which come to bear on them as soon as the spacers 6 in the form of contact bumps of the semiconductor chip 2 are placed on the resting areas 10 corresponding to them. The resting areas 10 are aligned exactly in such a way that the two or more spacers 6 come to lie on them when the semiconductor chip 2 is placed on exactly.

On account of the spacers 6 being made slightly shorter than the relaxed elastic contact elements 8, the elastic contact elements 8 are easily pressed in when the semiconductor chip 2 is placed on the printed circuit board 4, and are consequently in reliable conducting contact with the respectively corresponding contact terminal areas 12. Just like the resting areas 10, the contact terminal areas 12 are coated with a soldering paste 14, which becomes liquid when heated and can provide electrical connection of the elastic contact elements 8 to the corresponding contact terminal areas 12. Similarly, when the resting areas 10 covered with the soldering paste 14 are heated, stable mechanical connections are produced between the resting areas 10 and the respectively corresponding spacers 6 in the form of contact bumps disposed on the semiconductor chip 2.

FIG. 3 shows a cross section of a detail corresponding to FIG. 2 with the semiconductor chip 2 soldered on the printed circuit board 4. In this case, the spacers 6 have been placed on their associated resting areas 10; the elastic contact elements 8 are electrically in connection with the contact areas 12 associated with them of the printed circuit board 4. At the contact points, a secure soldered connection 16 is respectively produced by the liquefied and re-solidified soldering paste, providing stable mechanical and electrical connections.

In FIG. 4 there is also represented a schematic cross section of two semiconductor chips 2, which are connected to the printed circuit board 4 which can be fitted with components on both sides. For this purpose, the printed circuit board 4 is provided on both sides with non-illustrated interconnects and also with the resting areas 10 for the spacers 6 disposed on the semiconductor chips 2 and with numerous contact terminal areas 12 for the elastic contact elements 8. The semiconductor chips 2 already securely connected to the two sides of the printed circuit board 4 by soldered connections 16 are shown.

In the embodiment represented, the semiconductor chips 2 are additionally partly covered on their passive rear sides 3 with a layer of plastic 18, which may be enriched if appropriate with fine metallic powder, in order that it has a better thermal conductivity. Pressed onto the flat layer of plastic 18 on the upper and lower semiconductor chip 2 there is in each case a flat cooling device 20, which provides dissipation of the soldering heat from the semiconductor chips 2 during the soldering operation.

The method according to the invention for producing an electronic component which additionally contains a printed circuit board 4 and the semiconductor chips 2 with the wiring layer 30 mounted on it is described below on the basis of FIGS. 1 to 4. After preparing semiconductor chips 2 with in each case an active upper side with semiconductor circuit structures and the passive rear side 3 without semiconductor circuit structures, the wiring layer 30 is applied to the active upper sides of the semiconductor chips 2, for example by covering with polyimide. The wiring layer 30 is provided on its underside, facing away from the active upper side of the semiconductor chip 2, with a large number of elastic contact elements 8, which represent the electrical connections of the semiconductor chip to further electronic circuits. The wiring layer 30 is, moreover, provided with the spacers 6, for example in the form of contact bumps or contact pins, which provide a stable mechanical connection between the wiring layer 30 and the printed circuit board 4.

Each semiconductor chip 2 is preferably electrically connected by bonding connections to the wiring layer 3—assigned to it, the external electrical contacts of which are in turn formed by the elastic contact elements 8 of low mechanical strength in the spatial directions x, y and z. The printed circuit board 4 with the interconnects located on it is provided with contact terminal areas 12, which correspond to the elastic contact elements 8 of the electronic component with the semiconductor chip 2 and the wiring layer 30 to be fixed on the printed circuit board 4. The contact terminal areas 12 and also the resting areas 10 corresponding to the spacers 6 in the form of contact bumps are subsequently provided with soldering paste 14, before the semiconductor chips 2 with the wiring layer 30, the spacers 6 and the elastic contact elements 8 are mounted on the printed circuit board 4.

After the positioning of the semiconductor chips 2 with their wiring layers 30 on the printed circuit board 4, all the components are heated, so that the soldering paste 14 liquefies and forms stable soldered connections 16. As represented in FIG. 4, the printed circuit board 4 may be fitted from both sides with in each case at least one semiconductor chip 2. While heat for liquefying the solder is being applied, the cooling devices 20 are pressed onto the rear sides 3 of the semiconductor chips 2, covered with the layer of plastic 18, the cooling devices 20 providing dissipation of excessive temperature from the sensitive semiconductor components. In order that the thermal conductivity of the rear side 3 with respect to the cooling device 20 is improved, metallic powder may preferably be incorporated in the layer of plastic 18.

We claim:

1. A method for producing an electronic component, which comprises the steps of:
   providing a semiconductor chip having an active upper side and a passive rear side;
   applying a wiring layer to the active upper side of the semiconductor chip;
   applying elastic contact elements to one of the semiconductor chip and the wiring layer;
   producing bonding contacts from contact areas on the active upper side of the semiconductor chip to contact terminal areas on a rear side of the wiring layer, facing away from the active upper side of the semiconductor chip; and
   applying at least two spacers to outer edges of one of the semiconductor chip and the wiring layer, the spacers outlining an area the elastic contact elements lying within the area outlined by the spacers, the spacers being substantially non-elastic and mechanically connected to a printed circuit board;
   placing both the contact elements and the spacers directly between the chip and the printed circuit board, the spacers not being included in electrical connections of the electronic component, and the spacers being exceeded in height by the elastic contact elements in a relaxed state.

2. The method according to claim 1, which comprises:
   providing the printed circuit board with electrical contact terminal areas corresponding to free ends of the elastic contact elements, the printed circuit board having resting areas corresponding to the spacers;
   applying a soldering paste to the electrical contact terminal areas and to the resting areas of the printed circuit board;
   positioning the semiconductor chip and the wiring layer on the printed circuit board, the elastic contact elements resting on the contact terminal areas and the spacers resting on the resting areas; and
   heating connecting points, so that the soldering paste becomes liquid and produces electrical and mechanical connections.

3. The method according to claim 2, which comprises selecting at least two of the spacers from the group consisting of bumps and pins, and placing the spacers onto the printed circuit board on the resting areas corresponding to the spacers.

4. The method according to claim 2, which comprises pressing the elastic contact elements counter to their tension against the electrical contact terminal areas when the spacers are placed onto the resting areas of the printed circuit board corresponding to them.

5. The method according to claim 1, which comprises connecting the printed circuit board, electrically and mechanically, on both sides to in each came at least one semiconductor chip, the wiring layer, the elastic contact elements and the spacers.

6. The method according to claim 2, which comprises heating the electronic component to a soldering temperature for connecting the elastic contact elements.

7. The method according to claim 2, which comprises bringing substantially an entire surface area of the passive rear side of the semiconductor chip into contact with a heat-dissipating cooling device during a soldering operation.

8. An electronic component, comprising:
   at least one semiconductor chip;
   a wiring layer disposed on said semiconductor chip, said wiring layer having elastic contact elements of low mechanical strength in spatial directions x, y and z, said elastic contact elements to be electrically connected to contact terminal areas on a printed circuit board; and
   at least two spacers disposed on outer edges of one of said semiconductor chip and said wiring layer, said spacers outlining an area, said elastic contact elements lying within said area outlined by said spacer, said spacers being substantially non-elastic and serving to be mechanically connected to said printed circuit board;
   said contact elements and said spacers both being disposed directly between said chip and the printed circuit board, said spacers not being included in electrical connections of the electronic component, and said spacers being exceeded in height by said elastic contact elements in a relaxed state.

9. An electronic component, comprising;
   a printed circuit board having contact terminal areas;
   at least one semiconductor chip;
   a wiring layer disposed on said semiconductor chip, said wiring layer having elastic contact elements of low mechanical strength in spatial directions x, y and z, said elastic contact elements electrically connected to corresponding ones of said contact terminal areas; and
   at least two spacers disposed on outer edges of one of said semiconductor chip and said wiring layer, said spacers outlining an area, said elastic contact elements lying within said area outlined by said spacers, said spacers being substantially non-elastic and mechanically connected to said printed circuit board; said contact elements and said spacers both being disposed directly between said chip and said printed circuit board, said spacers not being included in electrical connections of the electronic component, and said spacers being exceeded in height by said elastic contact elements in a relaxed state.

10. The electronic component according to claim 9, wherein said wiring layer and said printed circuit board are mechanically connected at a defined distance from each other.

11. The electronic component according to claim 9, wherein said spacers are soldered.

12. The electronic component according to claim 9, wherein:
said semiconductor chip has an underside and said wiring layer is disposed on said underside;
said printed circuit board has an upper side with metallic resting areas disposed on said upper side; and said spacers are selected from the group consisting of bumps and pins, said spacers corresponding to said metallic resting areas on said upper side of said printed circuit board.

13. The electronic component according to claim 12, wherein said spacers are soldered to said metallic resting areas.

14. The electronic component according to claim 9, wherein said printed circuit board has resting areas, and said wiring layer is mechanically connected to resting areas of said printed circuit board by at least three of said spacers.

15. The electronic component according to claim 1, wherein said spacers are formed from plastic and have a metallic coating.

16. The electronic component according to claim 9, wherein said spacers have in each case an identical, exactly defined height.

17. The electronic component according to claim 9, wherein said elastic contact elements are flexible contact wires.

18. The electronic component according to claim 9, wherein said elastic contact elements are flat contact strips.

19. The electronic component according to claim 9, wherein said elastic contact elements are electrically conducting elastomeric contact humps.

20. The electronic component according to claim 9, wherein each of said elastic contact elements have a hump formed of an elastomeric plastic with an applied conduction path and a metallic covering disposed on a crest of said hump.

21. The electronic component according to claim 9, wherein said elastic contact elements have free ends and in each case are in an electrically conducting contact at said free ends with a corresponding one of said contact terminal areas on a surface of said printed circuit board.

22. The electronic component according to claim 9, wherein said elastic contact elements are in each case soldered to a corresponding one of said contact terminal areas of said printed circuit board.

23. The electronic component according to claim 9, wherein said elastic contact elements are microscopically small.

24. The electronic component according to claim 9, wherein said printed circuit board has resting areas, and said spacers and said resting areas are soldered to one another by heating.

25. The electronic component according to claim 9, wherein said semiconductor chip is one of at least two semiconductor chips each having said wiring layer disposed thereon, and said printed circuit board is provided on both sides with in each case at least one of said semiconductor chips having said wiring layer disposed thereon, said elastic contact elements, and said spacers, said spacers functioning as a mechanical connection and said elastic contact elements functioning as electrical connections.

* * * * *